United States Patent [19]

Takemoto

[11] 3,911,289

[45] Oct. 7, 1975

[54] MOS TYPE SEMICONDUCTOR IC DEVICE

[75] Inventor: Toyoki Takemoto, Kyoto, Japan

[73] Assignee: Matsushita Electric Industrial Co., Ltd., Osaka, Japan

[22] Filed: Aug. 16, 1973

[21] Appl. No.: 388,793

[30] Foreign Application Priority Data

Aug. 18, 1972 Japan .............................. 47-82640
Aug. 21, 1972 Japan .............................. 47-83452

[52] U.S. Cl. ................ 307/205; 307/214; 307/215; 307/304; 357/23; 357/42

[51] Int. Cl.[2] ................ H03K 19/08; H03K 19/34; H01L 29/78; H01L 27/04

[58] Field of Search ........... 307/205, 215, 304, 214

[56] References Cited

UNITED STATES PATENTS

| | | | |
|---|---|---|---|
| 3,651,342 | 3/1972 | Dingwall | 307/215 X |
| 3,832,574 | 8/1974 | Leehan | 307/205 |

OTHER PUBLICATIONS

Axelrod, "Speed Up Circuit...", IBM Tech. Discl. Bull., Vol. 7, No. 2, July 1964, pp. 168–169.

*Primary Examiner*—William D. Larkins
*Attorney, Agent, or Firm*—Stevens, Davis, Miller & Mosher

[57] ABSTRACT

A gate circuit having a plurality of gate inputs, for use in NAND, NOR or ROM (read only memory) circuits which are the basis of all of the logic circuits, comprising a load formed of a resistor or a MOS transistor, a driving stage including a plurality of MOS transistors for a plurality of input signals and having an output terminal another MOS transistor having a different conductivity type from said driving MOS transistors, and a complementary MOS inverter receiving the output of this gate circuit as the input and supplying the output to the gate of said another MOS transistor of different conductivity type. This structure provides a reduction in the number of interconnections of the constituent elements while achieving low power consumption and high speed operation together with the ease of circuit design.

7 Claims, 15 Drawing Figures

MOS TYPE SEMICONDUCTOR IC DEVICE

This invention relates to a MOS type semiconductor IC device comprising a multi-input complementary MOS gate circuit for use in gate circuits such as NAND or NOR, and ROM (read only memory) circuits which form the basis of all logic circuits.

Generally, a multi-input NAND or NOR gate circuit comprises a driving stage using MOS transistors and a load stage using a resistor or a MOS transistor. In an IC device, the number of interconnections is a large problem as well as the number of elements. In such multi-input gate circuits, however, reduction in the number of interconnections has been accompanied with an increase in the power consumption. Further, faster response has been accompanied with large power consumption.

Thus, an object of this invention is to provide a MOS type seiconductor IC device comprising a multi-input gate circuit having a simple structure and relatively few interconnections.

Another object of this invention is to provide a MOS type semiconductor IC device comprising a multi-input gate circuit of lower power consumption.

A further object of this invention is to provide a MOS type semiconductor IC device comprising a multi-input gate circuit including a lower number of elements, providing rapid operation and ease of circuit design.

According to an embodiment of this invention, there is provided a MOS type semiconductor IC device having a multi-input gate circuit comprising a driving stage including a plurality of MOS transistors having respective gates applied with input signals and a common output terminal, a load connected between the output terminal of said driving stage and a voltage source terminal and comprising a resistor or a MOS transistor, a MOS transistor of a different conductivity type from that of said plural MOS transistors in said driving stage connected between said output terminal and said voltage source terminal, and a complementary MOS inverter connected between said output terminal and said voltage source terminal and supplying the output to the gate of said MOS transistor of the different conductivity type. This MOS type semiconductor IC device can provide rapid operation with low power consumption and has a reduced number of elements and interconnections.

Figure 1A:
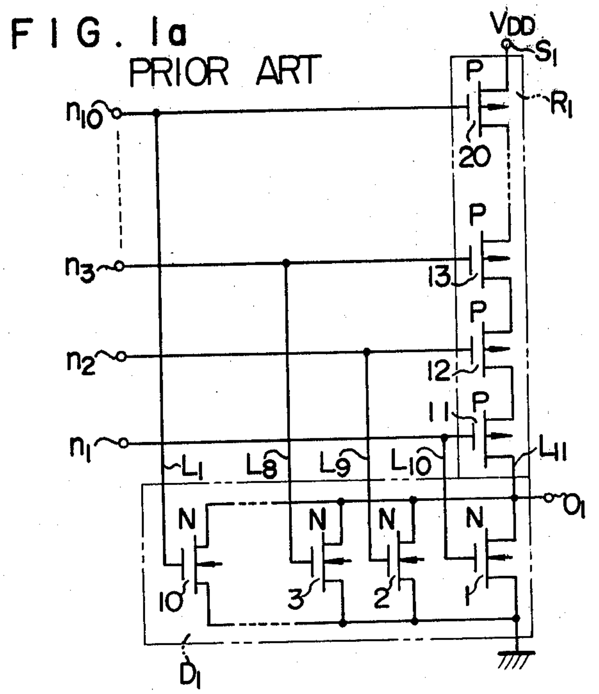
FIG. 1a PRIOR ART
Figure 1B:
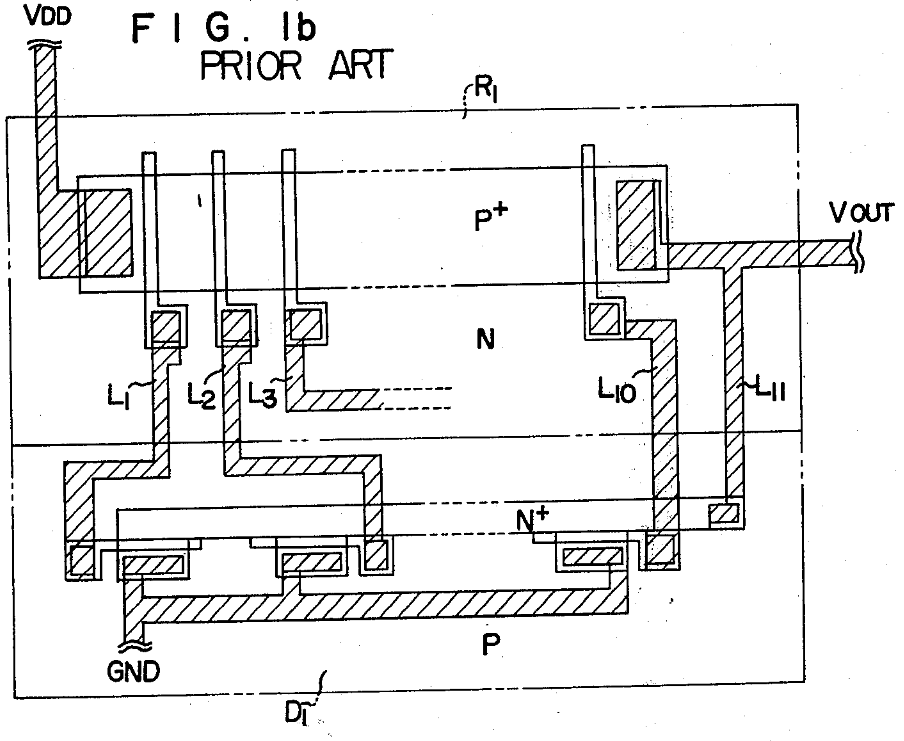
FIG. 1b PRIOR ART

Other objects, features, and advantages of this invention will become apparent from the following detailed description on preferred embodiments taken in conjunction with the accompanying drawings, in which:

FIG. 1*a* is a circuit diagram of a conventional 10-input complementary MOS NOR gate circuit;

FIG. 1*b* is a schematic plan view of a conventional MOS type semiconductor IC device of the circuit of FIG. 1*a;*

Figure 2A:
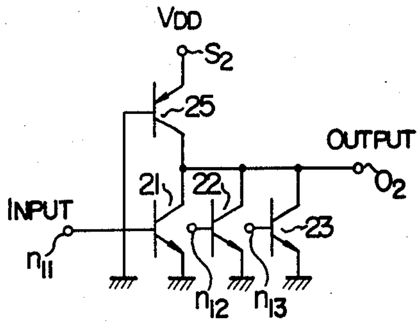
FIG. 2a PRIOR ART

FIG. 2*a* is a circuit diagram of a conventional three-input NOR gate circuit using bipolar transistors;

FIGS. 2*b*, 2*c*, 2*d*, and 2*e* are circuit diagrams of other conventional 3-input NOR gate circuits utilizing N channel MOS transistors in the driving stage and as the load an N channel enhancement MOS transistor, an N channel depletion MOS transistor, a P channel MOS transistor, and a resistor, respectively.

Figure 3A:
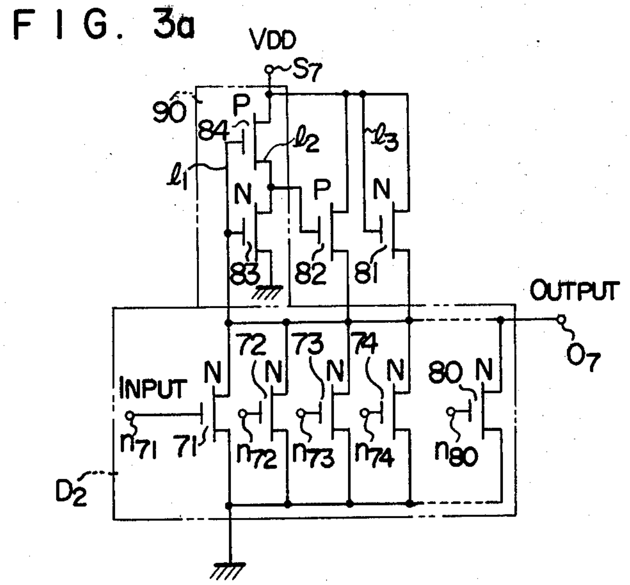
Figure 3B:
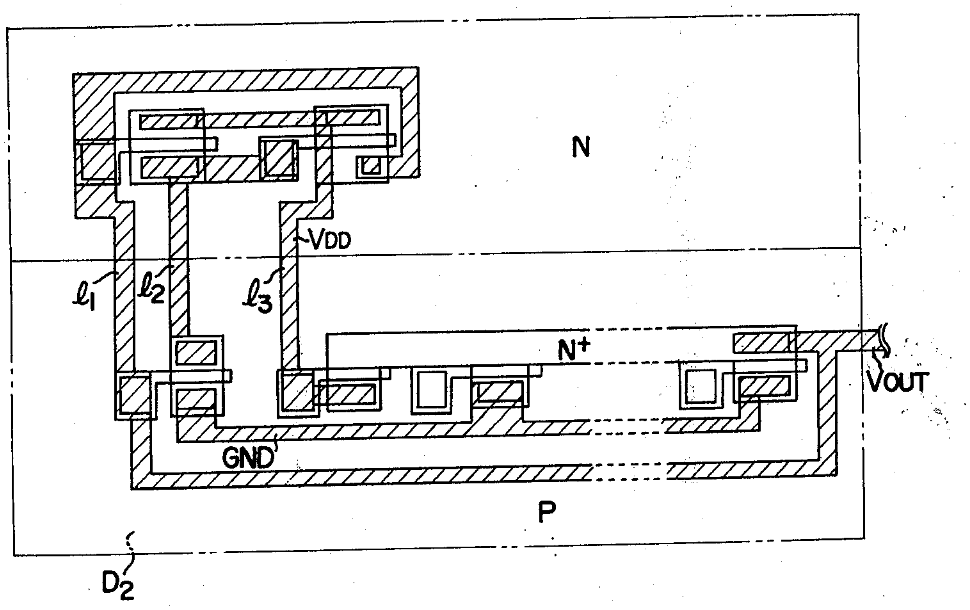

FIG. 3*a* is a circuit diagram of a 10-input NOR gate circuit according to an embodiment of this invention;

FIG. 3*b* is a schematic plan view of a MOS type semiconductor IC device of the circuit of FIG. 3*a;*

Figure 2B:
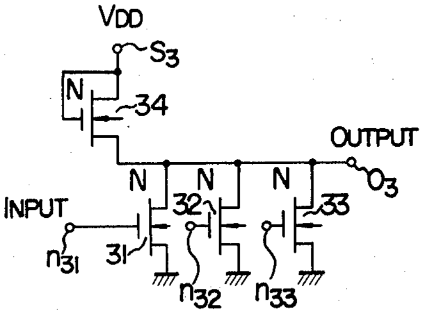
FIG. 2b PRIOR ART
Figure 2C:
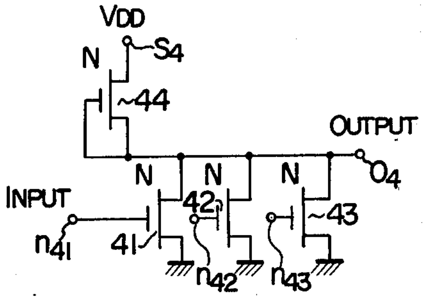
FIG. 2c PRIOR ART
Figure 2D:
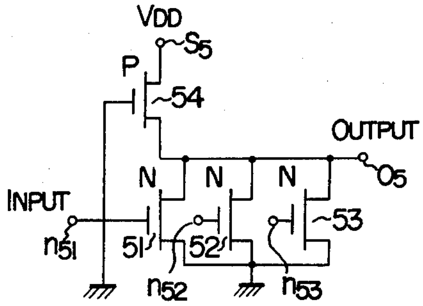
FIG. 2d PRIOR ART
Figure 2E:
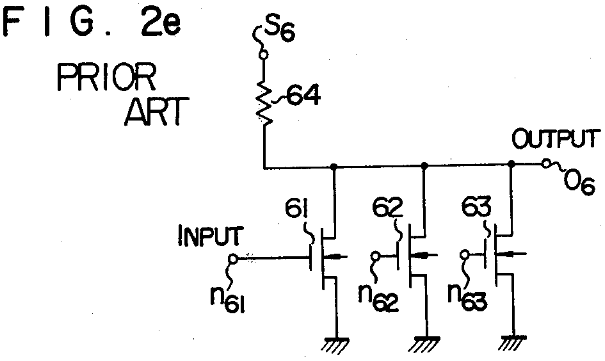
FIG. 2e PRIOR ART
Figure 7:
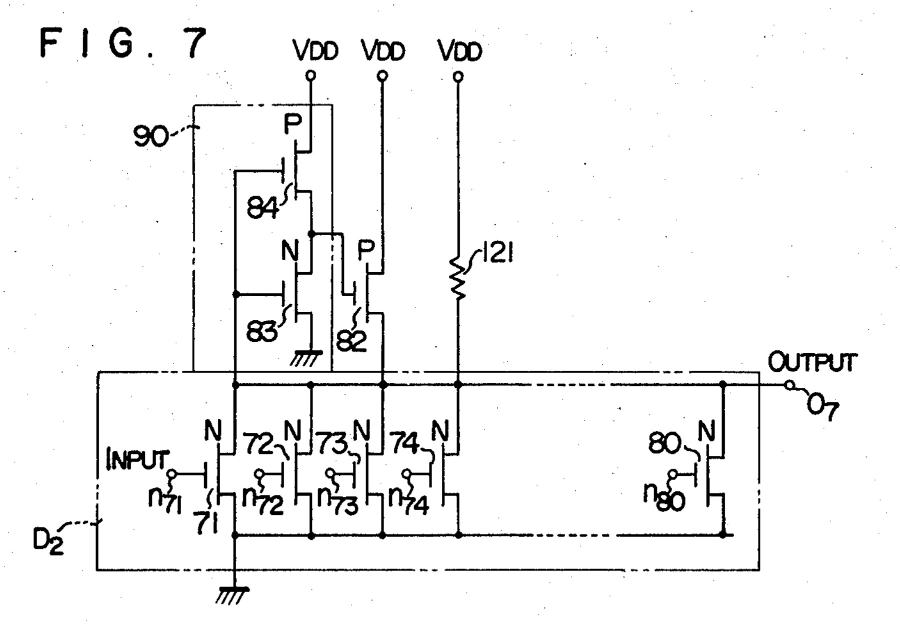
Figure 8:
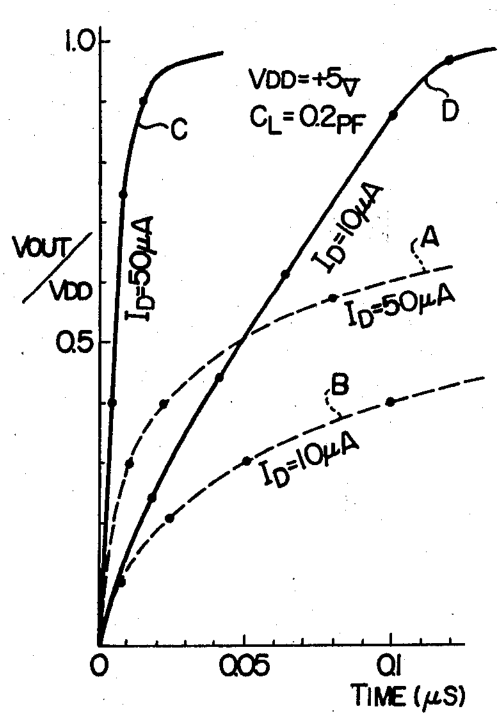
Figure 9:
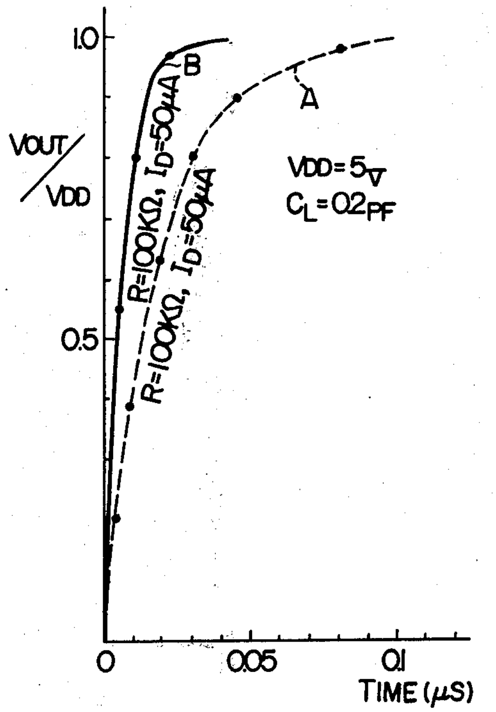

FIGS. 4, 5, 6, and 7 are circuit diagrams of 10-input NOR gate circuits according to other embodiments of this invention;

FIG. 8 shows the operational characteristics of the circuit of FIG. 3*a* in comparison with those of the circuit of FIG. 2*b;* and FIG. 9 shows the operational characteristics of the circuit of FIG. 7 utilizing a resistor as a load in comparison with those of the circuit of FIG. 2*e*.

First, for deeper understanding of the present invention, some of the conventional multi-input gate circuits will be described.

FIGS. 1*a* and 1*b* show a conventional 10-input NOR circuit using complementary MOS transistors. In the figures, a driving stage $D_1$ is formed of N channel driving MOS transistors 1 to 10 which have respective drain terminals connected in common to generate an output at an output terminal $O_1$. A load $R_1$ is formed of the same number of P channel load transistors 11 to 20 as that of the driving transistors which are cascade-connected between said output terminal $O_1$ and a voltage source terminal $S_1$ applied with a d.c. voltage $V_{DD}$. The gates of said respective transistors 1 to 10 and 11 to 20 are applied with input signals through gate terminals $n_1$ to $n_{10}$. Namely, the transistors 1 and 11, for example, are applied with an input gate signal through the gate terminal $n_1$. In this circuit, only when all of the input signals are at "0" level (0 volt), all of the MOS transistors 1 to 10 in the driving stage $D_1$ are turned off and all of the MOS transistors 11 to 20 in the load $R_1$ are turned on to generate a voltage of "1" level ($V_{DD}$) at the output terminal $O_1$. A feature of this circuit lies in the fact that the transistors 11 to 20 in the load stage $R_1$ can never be turned on simultaneously with any one of the transistors 1 to 10 in the driving stage being turned on, hence no d.c. current is allowed to flow between the source terminal $S_1$ and the ground at any time, and the power consumption is very small. Therefore, this circuit has been often used as a multi-input gate circuit. In the case of 10 inputs, however, 10 P channel and 10 other N channel MOS transistors become necessary and since the gate inputs for the respective P and N channel MOS transistors are common, at least 11 interconnections $L_1$ to $L_{11}$ are required. As is apparent from FIG. 1*b* which shows a schematic plan structure of a semiconductor IC device of the circuit of FIG. 1*a*, the greater the number of the MOS transistors of different conductivity type, the greater the number of the interconnections ($L_1$ to $L_{11}$). This is disadvantageous for the design of an IC device. For example, considering only the interconnections, it is necessary to dispose 11 aluminium wirings of a width 10 $\mu$ which need an area of a width 220 $\mu$. Thus, a large number of interconnections increases the required area of a semiconductor chip greatly.

For eliminating the above drawback, the following circuits have been proposed. FIG. 2*a* shows a three-input NOR circuit using bipolar transistors, in which three transistors 21, 22 and 23 having respective gate terminal $n_{11}$, $n_{12}$ and $n_{13}$ are connected in parallel and form a driving stage and another transistor 25 having a different polarity from that of said transistors 21 to 23 is connected between the common output $O_2$ and a voltage source terminal $S_2$. A d.c. voltage $V_{DD}$ is applied to the voltage terminal $S_2$ and an output is derived from the output terminal $O_2$. FIG. 2*b* shows another example of the conventional three-input NOR circuit in which three N channel MOS transistors 31, 32 and 33 form a driving stage and another N channel MOS transistor 34 forms a load stage. References $n_{31}$, $n_{32}$ and $n_{33}$ indicate input terminals, $O_3$ an output terminal and $S_3$ a voltage source terminal. FIGS. 2*c*, 2*d* and 2*e* show other examples of the conventional three-input NOR circuits, in which a load is formed of a depletion type MOS transistor 44, a P channel MOS transistor 54 and a resistor 64, respectively. References $n_{41}$ to $n_{43}$, $n_{51}$ to $n_{53}$, and $n_{61}$ to $n_{63}$ indicate input terminals, $O_4$, $O_5$ and $O_6$ output terminals, and $S_4$, $S_5$ and $S_6$ voltage source terminals. In the NOR circuits shown in FIGS. 2*a* to 2*e*, although the area required for interconnections is greatly reduced, a d.c. current is allowed to flow between the voltage source terminal and the ground when any of the transistors in the driving stage is turned on. Further, for increasing the operation speed a large current and hence a considerably large power consumption are required. Here, FIGS. 2*a* to 2*e* show the case of three inputs. In the case of 10 inputs, ten transistors are used in the driving stage to provide similar characteristics.

Now, embodiments of the present invention will be described.

FIG. 3*a* shows an embodiment of a 10-input NOR circuit according to this embodiment. N channel MOS transistors 71, 72, 73, . . . , 80 are connected between an output terminal $O_7$ and the ground in parallel to form a driving stage $D_2$. Input signals are supplied from respective gate input terminals $n_{71}$, $n_{72}$, $n_{73}$, . . . , $n_{80}$. An N channel enhancement MOS transistor 81 is connected between the output terminal $O_7$ and a voltage source terminal $S_7$ as a load. A source voltage $V_{DD}$ is applied to the source terminal $S_7$. The gate of the MOS transistor 81 is also connected to the source terminal $S_7$. A P channel enhancement MOS transistor 82 is connected also between the source terminal $S_7$ and the output terminal $O_7$. N and P channel MOS transistors 83 and 84 form a complementary MOS inverter 90 which is connected between the source terminal $S_7$ and the output terminal $O_7$ and supplies the output to the gate of said P channel transistor 82. FIG. 3*b* shows the schematic plan structure of a semiconductor IC device including this 10-input NOR gate circuit. As is apparent from this figure, in comparison with the conventional circuit shown in FIG. 1*b*, the number of elements and the area of wiring (hatched region) are considerably reduced. Namely, in the circuit of FIG. 1*a* the number of interconnections which may become a problem in the IC design is eleven, whereas in the circuit of FIG. 3*a* there are only three; $l_1$, $l_2$, and $l_3$. Further, the whole area of the semiconductor can also be reduced to one third of the conventional one.

Now, the operation of the 10-input NOR gate circuit of FIG. 3*a* will be described. It is assumed here that the source voltage $V_{DD}$ is 5 volts and each of the input voltage at the terminals $n_{71}$ to $n_{80}$ is 5 volts in 1 level and 0 volt (ground potential) in 0 level. Thus, the output voltage at the output terminal $O_7$ is 5 volts in 1 level and 0 volt in 0 level. In this NOR gate circuit, the output voltage at the output terminal $O_7$ becomes 1 level only when all of the input voltages at the terminals $n_{71}$ to $n_{80}$ are in 0 level. When any of the input voltages is in 1 level, at least one of the MOS transistors in the driving stage $D_2$ is turned on to bring the output terminal $O_7$ in the ground potential, i.e. 0 level. In this state, since the input for the complementary inverter 90, i.e., the output voltage at the terminal $O_7$, is in 0 level, the output of the complementary inverter 90 is in 1 level. Namely, since the P channel MOS transistor 84 is in the "on" state, the source voltage $V_{DD}$ (5 volts) is applied to the gate of the P channel MOS transistor 82 and thus the P channel MOS transistor 82 is in the "off" state. When all of the input voltages for said respective input terminals are in 0 level, the voltage at the output terminal $O_7$ gradually increases through the N channel MOS transistor load 81 which is always in on state. Since this output terminal $O_7$ is connected to the input terminal of the complementary MOS inverter 90, the complementary MOS inverter 90 is switched at a high speed to give an output of 0 level. Then, the gate signal for the P channel MOS transistor 82 becomes 0 volt and this P channel MOS transistor 82 is turned on. Thereby, the potential at the output terminal $O_7$ is rapidly raised to the source voltage $V_{DD}$, i.e., 1 level. The circuit shown in FIG. 3*a* is a 10-input NOR gate circuit, but it may be easily reformed to a NAND circuit of ten inputs by replacing all of the transistors in the driving stage $D_2$ with P channel MOS transistors, said enhancement type N channel load MOS transistor 81 with an enhancement type P channel MOS transistor, said P channel transistor 82 with an N channel MOS transistor, the voltage applied to the source terminal $S_7$ with the ground potential and the drain voltage of the P channel MOS transistors in the driving stage with $V_{DD}$ (e.g., 5 volts). Namely, when all of the components except the complementary inverter 90 are reversed, a 10-input NAND gate circuit can be provided. Further, in the circuit of FIG. 3*a* if all of the inputs are supplied through inverters and also the output is derived through an inverter, a 10-input NAND circuit can be provided.

In said embodiment shown in FIG. 3*a*, an N channel depletion type MOS transistor 81 having the gate connected to a voltage source is used as a load. Other embodiments of 10-input NOR gate circuit using a different element as a load are shown in FIGS. 4 to 7, in which the driving stage $D_2$, the complementary MOS inverter 90 and the P channel MOS transistor 82 are the same as those of FIG. 3a.

Figures 4, 5, 6:
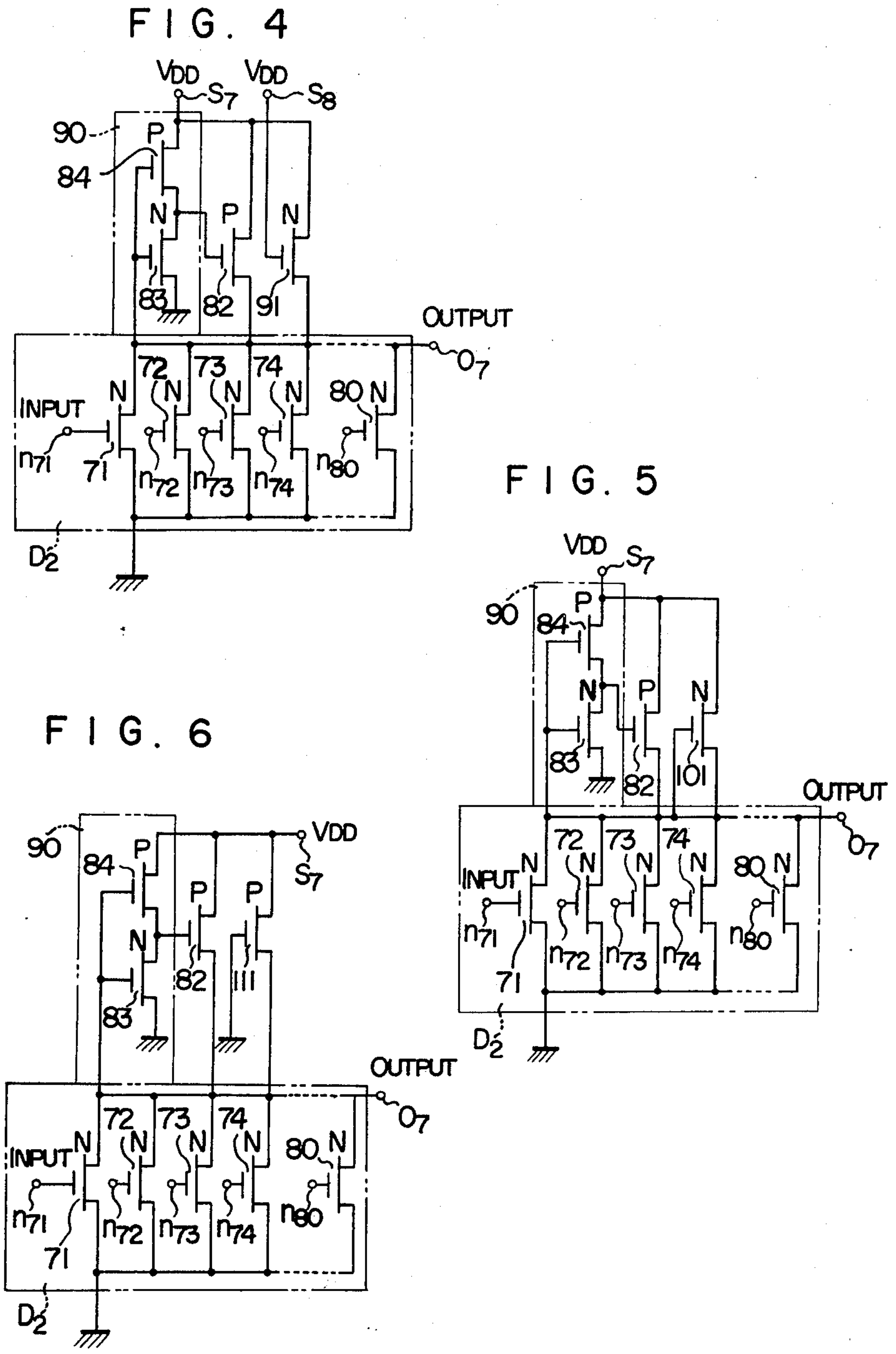

In the circuit of FIG. 4, the load is formed of an N channel enhancement type MOS transistor 91 having the gate terminal $S_8$ connected to a different voltage source. In the circuit of FIG. 5, the load is formed of an N channel depletion type MOS transistor 101 having the gate connected to the output terminal $O_7$. In the circuit of FIG. 6, the load is formed of an ordinary P channel enhancement type MOS transistor 111 having the gate grounded. In the circuit of FIG. 7, the load is formed of a resistor 121 (e.g., 100 kΩ). The response characteristics of the circuits shown in FIGS. 4 to 7 are almost the same as those of the circuit of FIG. 3*a*. On the other hand, a 10-input NAND circuit can be provided when the voltage source is reversed, the N channel MOS transistors in the driving stage are replaced with P channel MOS transistors, and the P channel MOS transistor 82 is replaced with an N channel MOS transistor (in the circuits of FIGS. 4 and 5, load MOS transistor 91 or 101 is replaced with an enhancement type P channel MOS transistor). For the circuit of FIG. 6, a 10-input NAND gate circuit can be provided similarly when a depletion type N channel MOS transistor having the gate applied with the source voltage $V_{DD}$ is used as the load. For the circuit of FIG. 7, since the load is a resistor, a 10-input NAND circuit can be provided only by replacing the polarity of the MOS transistors in the driving stage and the P channel MOS transistor 82.

Now, results of the comparison of the operational characteristics of the 10-input NOR circuit of FIG. *3a* and the three-input NOR circuit of FIG. *2b* are shown in FIG. 8, in which the abscissa represents time and the ordinate represents the ratio of the output voltage $V_{out}$ to the source voltage $V_{DD}$, $V_{out}/V_{DD}$. Namely, FIG. 8 shows the relation of the ratio of the output voltage to the source voltage from 0 level to 1 level with respect to time. The source voltage was set at 5 V and the total load capacitance $C_L$ was set at 0.2 pF. The broken curves A and B represents the response of the NOR gate circuit of FIG. *2b* when the drain current was set at 50 $\mu$A and 10 $\mu$A, respectively. In the circuit of FIG. 2b, it is to be noted that the output voltage does not perfectly reach the source voltage. For the curve A, it took about 0.05 $\mu$ sec. for the output voltage to reach one-half of the source voltage $V_{DD}$. For the curve B in which the drain current was reduced to 10 $\mu$ sec., it took about 0.5 $\mu$ sec. (not shown) for the output voltage to reach one-half of the source voltage $V_{DD}$. Thus, in the circuit of FIG *2b*, the drain current $I_D$ (and hence the power consumption) should be raised sufficiently to obtain rapid switching.

Solid curves C and D represent the response of the circuit of FIG. *3a*, in which the drain current $I_D$ was set at 50 $\mu$A and 10 $\mu$A, respectively. For the curve C ($I_D$= 50 $\mu$A), the time required for the output voltage $V_{out}$ to increase from 10 to 90 percent of the source voltage $V_{DD}$, i.e., rise time or turn-off time, was about 0.015 $\mu$ sec. For the curve D ($I_D$= 10 $\mu$A), the time required to reach one-half of the source voltage was the same as that for the case of the circuit of FIG. *2b* when the drain current was set at 50 $\mu$A. Namely, in the circuit of FIG. *3a* for achieving the switching time the same as that for the circuit of FIG. *2b* at $I_D$= 50 $\mu$A, the drain current $I_D$ can be reduced to one fifth, i.e., 10 $\mu$A.

The reason for this speed-up of the switching can be considered as follows. In the circuit of FIG. *3a*, the N channel load MOS transistor 81 serves only as the trigger for the switching of the MOS converter 90 and the complementary MOS inverter 90 induces a high speed switching action and rapidly brings the output terminal $O_7$ to the source voltage $V_{DD}$ through the P channel MOS transistor 82. Thus, the switching speed can be raised. Usually, only those MOS transistors which have far smaller mutual conductance ($g_m$) can be used as the load MOS transistors 34 and 81 from the point of circuit operation. Therefore, the operation speed was inevitably low in the circuit of FIG. *2b*. In the circuit of FIG. *3a*, however, the mutual conductance $g_m$ of the P channel MOS transistor 82 can be set greater (e.g., five times) than that of the load MOS transistor 81 and hence the switching speed can be improved greatly. Namely, since the P channel MOS transistor 82 is turned on only when all of the MOS transistors in the driving stage $D_2$ are turned off, the P channel MOS transistor 82 can have a larger mutual conductance $g_m$ than the load MOS transistor 81. Thus, in the circuit of FIG. *3a*, there is no need for accurate control in the ratio of the resistances in the driving and the load stages and in the wafer processing in integrating the circuit. Further, this circuit is of the ratio-less type and hence the output voltage does not remain below the source voltage and perfectly changes from O V to the source voltage, as can be seen from the curves A and B in FIG. 8.

Further, comparison of the switching speed of the circuits of FIGS. 7 and 2e which use a resistor 121 or 64 as the load is shown in FIG. 9. The abscissa and the ordinate represent time and the ratio of $V_{out}/V_{DD}$, similar to FIG. 8. In FIG. 9, broken curve A represents the characteristic of the circuit of FIG. 2*e* when $I_D$= 50 $\mu$A and solid curve B represents the characteristic of the circuit of FIG. 7 when $I_D$= 50 $\mu$A. In both cases, the resistance 64 or 121 was 100 kΩ. Referring to the curves A and B, it can be seen that the turn-off time of the circuit of FIG. 7 is reduced less than one fourth of that of the circuit of FIG. 2*e*.

As is apparent from the above description, according to the present MOS type semiconductor IC device having a multiple input gate circuit, the number of interconnections can be reduced as much as possible while the requirements for high speed and low power consumption can be sufficiently satisfied.

What we claim is:

1. A metal-oxide-semiconductor type semiconductor integrated circuit device having a multi-input gate circuit comprising:

a driving stage including a plurality of metal-oxide semiconductor transistors of one conductivity type having respective gates for receiving input signals and a common output terminal, said plurality of metal-oxide-semiconductor transistors being connected in parallel with each other;

a first load connected between said output terminal of the driving stage and a voltage source terminal;

a second load consisting of a metal-oxide-semiconductor transistor having an opposite conductivity type from that of said plurality of metal-oxide-semiconductor transistors and connected in parallel with said first load between said output terminal and said voltage source terminal for establishing a current path therebetween; and a complementary metal-oxide-semiconductor inverter connected between said output terminal and said voltage source terminal and supplying the output thereof to the gate of said metal-oxide-semiconductor transistor of the opposite conductivity type, the total conductance of said first and second loads changing rapidly in response to an inversion signal at said common output terminal, said inversion signal being determined by input signals applied to said driving stage.

2. A metal-oxide-semiconductor type semiconductor integrated circuit device according to claim 1, in which said first load comprises an enhancement type metal-oxide-semiconductor transistor of the same conductivity type as that of the metal-oxide-semiconductor transistors in the driving stage, said first load transistor having a drain and a gate connected in common with the voltage source terminal.

3. A metal-oxide semiconductor type semiconductor integrated circuit device according to claim 1, in which said first load comprises an enhancement type metal-oxide-semiconductor transistor of the same conductivity type as that of the metal-oxide-semiconductor transistors in the driving stage, said first load transistor having a gate connected to a different voltage source.

4. A metal-oxide semiconductor type integrated circuit device according to claim 1, in which said first load comprises an enhancement type metal-oxide semiconductor transistor of an opposite conductivity type to that of the metal-oxide-semiconductor transistors in said driving stage.

5. A metal-oxide-semiconductor type semiconductor integrated circuit device according to claim 1, in which said first load comprises a resistor.

6. A metal-oxide-semiconductor type integrated circuit device according to claim 1, in which said complementary inverter comprises first and second metal-oxide-semiconductor inverter transistors of opposite types, the source of said first inverter transistor being connected to said voltage source terminal, the drain of said first inverter transistor and the source of said second inverter transistor being connected together and to the gate of said second load transistor and the gates of said first and second inverter transistors and the drain of said second inverter transistor being connected in parallel with the transistors in said driving stage.

7. A metal-oxide-semiconductor type integrated circuit device according to claim 1, in which said first load comprises an enhancement type metal-oxide-semiconductor transistor of the same conductivity type as that of the metal-oxide-semiconductor transistors in the driving stage, said first load transistor having a gate connected to the output terminal of said driving stage.

* * * * *